United States Patent
Couteau et al.

(10) Patent No.: US 6,348,289 B1
(45) Date of Patent: Feb. 19, 2002

(54) SYSTEM AND METHOD FOR CONTROLLING POLYSILICON FEATURE CRITICAL DIMENSION DURING PROCESSING

(75) Inventors: Terri A. Couteau, Rosanky; W. Jarrett Campbell; Anthony Toprac, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/366,486

(22) Filed: Aug. 3, 1999

(51) Int. Cl.[7] ................................................ G03F 7/30
(52) U.S. Cl. .......................................... 430/30; 438/17
(58) Field of Search ............................... 430/30; 438/17

(56) References Cited

U.S. PATENT DOCUMENTS 4,978,923 A * 12/1990 Maltiel ....................... 324/693
5,843,847 A * 12/1998 Pu et al. ..................... 438/723

* cited by examiner

*Primary Examiner*—Hoa Van Le
(74) *Attorney, Agent, or Firm*—Kevin L. Daffer; Conley, Rose & Tayon (57) ABSTRACT

A method for processing a semiconductor topography is presented. In the present processing method, a semiconductor topography may be provided having a polysilicon feature arranged above a semiconductor substrate. The polysilicon feature may have an initial polysilicon feature critical dimension (CD). A chemical mixture, preferably contained in a chemical vessel, may also be provided. A polysilicon etch rate-effective attribute of the chemical mixture may be measured. Subsequently, an exposure time to the chemical mixture for the semiconductor topography may be calculated from the polysilicon etch rate-effective attribute, the initial polysilicon feature CD, and a goal polysilicon feature CD. By calculating an exposure time for the semiconductor topography in such a manner, the method preferably allows a final polysilicon feature CD to be more accurately controlled than in conventional processes.

10 Claims, 7 Drawing Sheets

SYSTEM AND METHOD FOR CONTROLLING POLYSILICON FEATURE CRITICAL DIMENSION DURING PROCESSING

BACKGROUND OF THE INVENTION

1. Field of the Invention

This invention relates to semiconductor processing and, more particularly, to systems and methods for controlling polysilicon feature critical dimension during processing.

2. Description of the Related Art

The information described below is not admitted to be prior art by virtue of its inclusion in this Background section.

The desire to reduce contamination in semiconductor fabrication processes is never-ending. In such processes, contamination can arise in many forms, including as particulates, organic residues, and inorganic residues. Even in trace amounts, the presence of contaminants on a wafer surface can produce defects in semiconductor devices formed on the wafer. These defects can prove highly problematic; in some cases, just one very small defect can render a circuit inoperable. Consequently, it is generally desirable to reduce the amount of contaminants on a wafer surface as much as possible.

Because eliminating contamination is so important, cleaning processes play a large role in semiconductor fabrication processes. A variety of cleaning processes may be used in a semiconductor fabrication sequence. The particular type of process used often will vary with the type of contaminants to be removed, as well as with other process considerations. Most semiconductor cleaning processes, however, fall into the category of wet cleaning. Generally speaking, wet cleaning processes are processes in which liquid chemical solutions are used to clean contaminants from a wafer surface. Cleaning may be performed by immersing the wafer in the cleaning solution, or by other techniques such as spraying a cleaning solution onto a rotating wafer. After cleaning is complete, the wafer is typically rinsed and dried.

One of the most important segments of semiconductor processing is the fabrication of metal-oxide-semiconductor (MOS) circuits. Cleaning processes play a large role in MOS circuit manufacturing, particularly in one of the most fundamental steps of such processes: the formation of the polysilicon transistor gates. While there are numerous methods of forming an MOS transistor gate, a typical process may begin by forming a gate oxide upon the surface of a single-crystal silicon wafer. A layer of polysilicon is then formed above the gate oxide layer. Subsequently, an anti-reflective coating (ARC) layer is formed above the polysilicon layer. The ARC layer is typically a layer of dielectric material, such as silicon oxynitride, upon which resist will be deposited. The ARC layer serves to minimize reflections during resist exposure. Resist may then be spun on, exposed, and developed, leaving a pattern corresponding to the desired pattern of the polysilicon gates. An anisotropic etch process, such as reactive ion etching, may then be used to remove polysilicon (as well as directly overlying portions of the ARC layer) not protected by the developed resist pattern. After etching is complete, the remaining resist and ARC waiters are stripped. Etch processes often produce a substantial amount of contamination, and so after etching is complete the wafer may be rinsed, and then immersed in a cleaning solution. Following immersion, the wafer may be rinsed again and dried.

An important objective of the gate formation process is to produce a gate having a particular critical dimension. The critical dimension of a feature, such as a gate, is essentially the width of that feature. Because of the exacting nature of semiconductor devices, it is desirable to maintain the critical dimension (CD) of features within design tolerances. For example, in self-aligned structures, the channel length is established by the gate width. As the channel length influences, among other things, the speed of a transistor, control of the gate CD is important. Fortunately, current photolithographic processes are capable of producing a gate having a post-gate etch critical dimension (PG CD) relatively close to a desired value.

Unfortunately, the processes that follow gate etch can significantly reduce the gate critical dimension from the PG CD. For example, an ARC layer composed of silicon oxynitride may typically be stripped using a solution of reflux boiled phosphoric acid. While effective at removing silicon oxynitride, the phosphoric acid solution can etch the polysilicon of which the gate is composed. Furthermore, subsequently employed cleaning processes may also etch polysilicon. As such solutions typically remove silicon from a gate at substantially equal rates on both sides of the gate, the total CD reduction will be about twice the polysilicon etch rate of the solutions. Thus, the total CD reduction resulting from post-gate etch processes can be significant, e.g., 5–10 nm or more. Consequently, the final CD of a polysilicon gate after post-gate etch processing is complete can be significantly less than PG CD.

Losses in gate CD resulting from post-gate etch processing can be partially compensated for, however. As stated above, current photolithographic processes allow for significant control of gate critical dimension. Consequently, the PG CD may be adjusted in accordance with the expected CD reduction that will result from post-gate etch processing. Thus, if one could accurately predict the amount of gate CD that will be lost to post-gate etch processing, a polysilicon gate could be produced with a final CD (i.e., CD after post-gate etch processing is complete) that is very close to a goal CD.

As might be expected, however, the CD loss from post-gate etch processing can be difficult to predict. The extent to which such processes etch polysilicon and other silicon-bearing surfaces is dependent on the relative values of the etch-rate effective attributes of the solutions, such as concentration or temperature. In semiconductor processing, however, chemical solutions are often repeatedly used on numerous lots of wafers, and values of the etch-rate effective attributes of the solutions tend to vary with time. In addition, the amount of variation can be further dependent on variables that are not always constant from run-to-run. As such, attempts to precisely estimate the CD loss from post-gate etch processing can be easily frustrated.

An example of the above may be seen in a cleaning process commonly used to remove contaminants arising during the poly gate formation process, the SC1 clean. The SC1 clean is a component process of the traditional RCA cleaning process, and is especially useful in the removal of organic and metallic contaminants. SC1 solutions are solutions of water, hydrogen peroxide ($H_2O_2$), and ammonium hydroxide ($NH_4OH$) (in order of decreasing concentration), which are typically maintained between 60 and 85° C. during use. In addition, SC1 solutions may include other chemicals, such as chelating agents used to bind up metallic ions present in the solution. SC1 solutions may etch polysilicon by a continual oxidation-reduction process of forming an oxide layer and removing the oxide layer.

The rate at which an SC1 solution etches polysilicon depends on etch-rate effective parameters of the solution such as the solution temperature and the respective concentrations of hydrogen peroxide and ammonium hydroxide within the solution. Higher relative concentrations of ammonium hydroxide to hydrogen peroxide within a SC1 solution can result in elevated silicon etch rates during cleaning.

Over time, the etch-rate effective attributes of an SC1 solution may vary significantly. For example, as an SC1 solution is repeatedly used, hydrogen peroxide within the solution may decompose. Such decomposition can occur, for example, as the result of impurities accumulating within the solution or the solution temperature rising too far above certain levels. As the concentration of hydrogen peroxide within a SC1 solution decreases, the polysilicon etch rate of that solution will tend to correspondingly increase. Furthermore, the variables that affect hydrogen peroxide decomposition are often inconstant from run-to-run, making precise estimates of the polysilicon etch rate of an SC1 solution at a given point difficult to obtain.

Nevertheless, manufacturers have historically attempted to predict changes in concentration and other attributes of SC1 and other cleaning solutions over time using various qualification processes. Generally speaking, qualification processes attempt to characterize how various parameters of a process will change with time. For example, some qualification techniques incorporate a series of test wafers which may be sequentially sent through a chemical bath to determine how long the bath should be used before chemical concentrations (or other attributes) of the cleaning solution within the bath fall outside of acceptable ranges. In addition, these processes may attempt to qualify how the polysilicon etch rate of a cleaning solution changes with time. From the data obtained in such a qualification process, the bath life may be estimated, and the residence time for which wafers should be immersed in the bath may be adjusted accordingly. However, such characterization techniques only estimate concentration from historical data, and thus are not always sensitive to the variations that may occur from run-to-run. In addition, when qualification wafers are being run through a process production wafers are not, so the extensive qualification of a process can reduce the total amount time that process is available to process production wafers.

Furthermore, other variations in etch-rate effective attributes may not be predictable from qualification processes. For example, SC1 and other cleaning solutions are often mixed from separate sources in a single tank during a process called pour-up. In a typical design, metering pumps are used to supply each constituent chemical of the solution being poured-up. The tanks also may include capacitive sensors to detect solution levels and control the balance of deionized water during pour-up. The pour-up process is typically an automated process that utilizes the metering pumps and capacitive sensors to mix a solution having a desired concentration. If not all the components of the pour-up system are operating optimally, however, bad pour-ups (i.e., situations in which the solution concentrations after pour-up are not at desired levels), can result. Because the predictions made from qualification processes tend to assume that the initial concentration of the solution will be at or near a desired value, such predictions may be inaccurate when made on a solution resulting from a bad pour-up. And since in typical cleaning processes the concentration of a cleaning solution is not measured each time before it is used on a production wafer, the etch rate of a solution resulting from a bad pour-up may be significantly different from predicted levels.

Because of problems such as these, even after attempting to compensate for expected losses from post-gate etch processing the final CD of a polysilicon gate conductor can differ from a goal CD of that a gate conductor by 5–10 nm or more. The trend throughout the history of semiconductor manufacturing has been for critical dimensions to reduce further and further in size. Moreover, as long as such critical dimension reductions allow more devices to be formed on a single wafer (thus increasing profitability), that trend should continue for years to come. But as critical dimensions continue to shrink, the variance in final CD produced by the inability to precisely determine the CD loss during cleaning becomes increasingly unacceptable. While relatively minor at larger feature sizes, critical dimensions of sub-quarter-micron or less can make differences of 5–10 nm between a poly gate final CD and its goal CD extremely significant. In fact, at such sub-quarter-micron feature sizes the presence of such a final CD to goal CD disparity can drag an otherwise profitable process into unprofitability. As critical dimensions continue to decrease, the detrimental aspects of such disparities will only grow larger.

In an attempt to avoid these problems, some manufactures have limited or eliminated the use of cleaning solutions that attack silicon (e.g., SC1 solutions). However, it is difficult, if not impossible, to achieve an optimal level of particulate reduction with cleaning solutions that do not to some degree attack silicon (e.g., rinse water or certain solvents). While such manufacturers may avoid the CD loss associated with these silicon-etching cleaning solutions, they often do so at the cost of a higher defect density, lower overall yield, and reduced process profitability.

Therefore, it would be desirable to design a method of determining the exposure time of a wafer to a chemical solution that would allow the final CD of a polysilicon feature to be more accurately controlled than in conventional processes. The method should consistently produce polysilicon gate conductors having a final CD that is substantially equal to a goal CD. It would also be advantageous if the method could accomplish such a goal while still using cleaning solutions that etch polysilicon, to allow for optimal cleaning of a semiconductor topography.

SUMMARY

The problems described above are in large part addressed by the method for processing a semiconductor topography presented herein. In the present processing method, a semiconductor topography may be provided having a polysilicon feature arranged above a semiconductor substrate. The polysilicon feature may have an initial polysilicon feature critical dimension (CD). A chemical mixture, preferably contained in a chemical vessel, may also be provided. A polysilicon etch rate-effective attribute of the chemical mixture may be measured. Subsequently, an exposure time to the chemical mixture for the semiconductor topography may be calculated from the polysilicon etch rate-effective attribute, the initial polysilicon feature CD, and a goal polysilicon feature CD. By calculating an exposure time for the semiconductor topography in such a manner, the method preferably allows a final polysilicon feature CD to be more accurately controlled than in conventional processing methods.

The present processing method preferably allows for consistent production of a final polysilicon feature CD (i.e., the CD after exposing the semiconductor topography to the chemical mixture) that is closer to a goal polysilicon feature CD than is obtainable by conventional processing methods. It should be understood that, even with the CD control attainable with the present processing method, it may not be possible to consistently produce a final polysilicon feature that is precisely equal to a goal polysilicon feature CD. However, the present processing method is preferably capable of calculating an exposure time to the chemical mixture for the semiconductor topography of such duration that after exposing the semiconductor topography to the polysilicon feature for the exposure time, the polysilicon feature has a final CD substantially equal to a goal polysilicon feature CD. After exposing the semiconductor topography to the chemical mixture, the final polysilicon feature CD may be within 5 nm of the goal polysilicon feature CD, is preferably within 3 nm of the goal polysilicon feature, and more preferably is within 1 nm of the polysilicon feature CD.

As stated above, if a chemical mixture resulting from a bad pour-up or that suffers a metering pump failure during pour-up is exposed to a semiconductor topography, the results can be disastrous. Since one or more polysilicon etch-rate effective attributes of a chemical solution may be measured and an appropriate exposure time to a chemical mixture calculated before the semiconductor topography is exposed to the chemical mixture, however, the present method may detect whether a chemical mixture has been affected by such problems. Even if the chemical mixture has a concentration that deviates significantly from desired levels (e.g., a badly poured-up solution), the processing method's ability to adjust the exposure time to account for different etch rates allows such a chemical mixture to be used in processing. And if the chemical mixture is so far from desired levels as to render it completely unusable, the method is preferably able to prevent the mixture from being exposed to a semiconductor topography.

In addition, the processing method may be repeated for multiple semiconductor topographies processed by the same chemical mixture. As an exposure time is preferably calculated for each semiconductor topography before the topography is exposed to the chemical mixture, changes in the etch rate of the chemical mixture may be accounted for. Even if the etch rate of the chemical changes relatively quickly and for unpredictable reasons, the present method may calculate an exposure time to the chemical mixture for a semiconductor topography that is to produce a polysilicon feature having a CD very near to a desired value.

The chemical mixture is preferably a cleaning solution, and more preferably is a cleaning solution capable of etching polysilicon (e.g., SC1, SC2, and piranha solutions). And because the processing method is able to accurately control CD losses from etching, chemical mixtures that etch polysilicon may be safely exposed to a semiconductor topography. As such, optimal cleaning of semiconductor topography may be attained.

Calculating the exposure time to the chemical mixture for the semiconductor topography preferably includes calculating a polysilicon etch rate of the chemical mixture from the etch rate-effective attribute value of the chemical mixture. The polysilicon etch rate of the chemical mixture may be calculated in a variety of ways, for example, by using formulas, fits to collected data, or a lookup table of polysilicon etch rates at a variety of values of the polysilicon etch rate-effective attribute or attributes. (For the purposes of this disclosure, "calculating x from y" may be considered to mean that y is a parameter in the calculation of x; y is not necessarily the only parameter used in the calculation of x. The polysilicon etch rate is further preferably calculated for the particular properties of the polysilicon of which the feature is composed, and may take into account, the presence or absence of dopants, method of doping if dopants are present, the doping profile of the feature, the grain structure of the feature, as well as a variety of other properties of the polysilicon feature that may affect the etch rate of the chemical mixture for that feature.

One or more etch rate-effective attribute values may be used in calculating a polysilicon etch rate. Preferably, however, the etch rate effective attributes used in calculating the polysilicon etch rate of the chemical mixture are a plurality of concentrations of a plurality of chemicals within the chemical mixture and a temperature of the chemical mixture. The concentrations used in calculating the polysilicon etch rate of the chemical mixture are preferably all chemicals that affect the polysilicon etch rate of the chemical mixture. Accordingly, measuring an etch rate-effective attribute value of the chemical mixture preferably involves measuring a plurality of concentrations of a plurality of chemicals within the chemical mixture and measuring a temperature of the chemical mixture. These attribute values may be measured with a suitably configured concentration sensor.

After calculation, the polysilicon etch rate of the chemical mixture may be input into the exposure time calculation algorithm. The exposure time calculation algorithm may include a set of precisely defined operations, rules, or processes for calculating the exposure time to the chemical mixture for the semiconductor topography. The exposure time calculation algorithm may accept any number of inputs, may incorporate any number of calculations, and may employ any variety of techniques to calculate the exposure time.

The initial polysilicon feature CD and the goal polysilicon feature CD may also be input into the exposure time calculation algorithm. Preferably, the initial polysilicon feature CD may be calculated in a metrology process performed after defining the feature, and may then be transmitted to, e.g., a process controller directing the execution of the method. Alternately, the initial polysilicon feature CD may be a stored value within, e.g., a storage element of the process controller, produced in an earlier calculation or derived from historical data. The semiconductor topography preferably comprises a plurality of polysilicon features. As such, the initial, final, and goal polysilicon feature CDs are preferably an aggregate CD for the polysilicon features of an entire semiconductor topography, and may not necessarily be the CD of any one particular feature. For example, the above-described polysilicon feature CDs may be average CD values for all polysilicon features of interest on a semiconductor topography.

The goal polysilicon feature may be the desired CD after the semiconductor topography is exposed to the chemical mixture. The goal polysilicon feature CD may likewise be transmitted for each semiconductor topography as it is processed, but may also be a pre-determined value stored in, e.g., a storage element of a process controller.

While, as stated above, the exposure time algorithm may accept any number of inputs in calculating the exposure time, the algorithm preferably calculates an exposure time with the polysilicon etch rate of the chemical mixture, the initial polysilicon feature CD, and the goal polysilicon feature CD. The chemical mixture is preferably a liquid capable of etching polysilicon. Consequently, the chemical mixture preferably etches polysilicon isotropically (i.e., in substantially the same rate in all directions). Therefore, the chemical mixture may etch the sidewalls of the polysilicon feature at substantially the same rate. As the critical dimension of the polysilicon feature may be defined by the distance from sidewall to sidewall, the CD reduction rate of the chemical mixture is preferably substantially twice the polysilicon etch rate of the chemical mixture. As the polysilicon etch rate of the chemical mixture preferably represents the average polysilicon etch rate of the chemical mixture during the time the semiconductor topography is exposed to the chemical mixture, the exposure time may be calculated as exposure time=(the initial polysilicon feature CD−the goal polysilicon feature CD)/(2*the polysilicon etch rate of the chemical mixture). An exposure time variable is preferably set to the calculated exposure time value to be used in subsequent processing steps.

In a preferred embodiment, the polysilicon feature is a gate conductor arranged upon a gate dielectric layer. However, the polysilicon feature may be any of the variety of polysilicon structures formable in semiconductor processing, including polysilicon interconnect structures (e.g., local interconnect).

An embodiment includes a system for processing a semiconductor topography. The processing system is preferably configured to process a semiconductor topography having a polysilicon feature arranged above a semiconductor substrate. The processing system preferably includes a chemical vessel containing a chemical mixture. The processing system may also include a sensor. The sensor may be configured to be in fluid communication with the chemical vessel. Furthermore, the sensor is preferably configured to measure a value of a polysilicon etch rate-effective attribute of the chemical mixture.

The processing system may further include a process controller. The process controller is preferably configured to direct the operation of the processing method. The process controller may be configured to receive the polysilicon etch-rate effective attribute value of the chemical mixture from the sensor. The process controller is further configured to calculate an exposure time to the chemical mixture for the semiconductor topography from the polysilicon etch rate-effective attribute value, an initial polysilicon feature critical dimension of the polysilicon feature, and a goal polysilicon feature CD.

The processing system may further include a processing tool. The processing tool is preferably configured to receive the exposure time from the process controller. After receiving the exposure time, the processing tool is further preferably configured to expose the semiconductor topography to the chemical mixture for the exposure time. The processing tool may expose the semiconductor topography to the chemical mixture by immersing the semiconductor topography in a chemical mixture. Alternately, the processing tool may expose the semiconductor topography to the chemical mixture by spraying the chemical mixture on the semiconductor topography as it is rotating. Preferably, the processing tool is configured to expose a plurality of semiconductor topographies (e.g., a lot of 25 wafers) at once. Exposure to the chemical mixture may be performed in the chemical vessel or in another vessel (e.g. a processing vessel) to which the chemical mixture is transported.

The process controller is preferably configured to interface with the various components of the processing system to direct the processing method. As such, the process controller may be considered to provide "intelligence" for the processing system. The process controller is preferably configured to receive measured etch rate-effective values from the sensor. The process controller may include a display unit configured to display the measured etch rate-effective values.

Additionally, the actions of the processing system are preferably at least partially directed through software. The programming instructions may be at least temporarily stored in a storage element of the process controller. The storage element may be any type of media configured to store, if only temporarily, several groupings of instructions for carrying out several processing steps.

An embodiment is directed to processing steps by which programming instructions, preferably residing in the storage element, may be executed by the process controller to direct the operation of components of the processing system. The processing steps may include receiving a polysilicon etch rate-effective attribute value of a chemical mixture from the sensor, calculating an exposure time to the chemical mixture for a semiconductor topography from the polysilicon etch rate-effective attribute value of the chemical mixture, an initial polysilicon feature critical dimension (CD), and a goal polysilicon feature CD, and transmitting the exposure time to a processing tool configured to expose the semiconductor topography to the chemical mixture during operation.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 3:
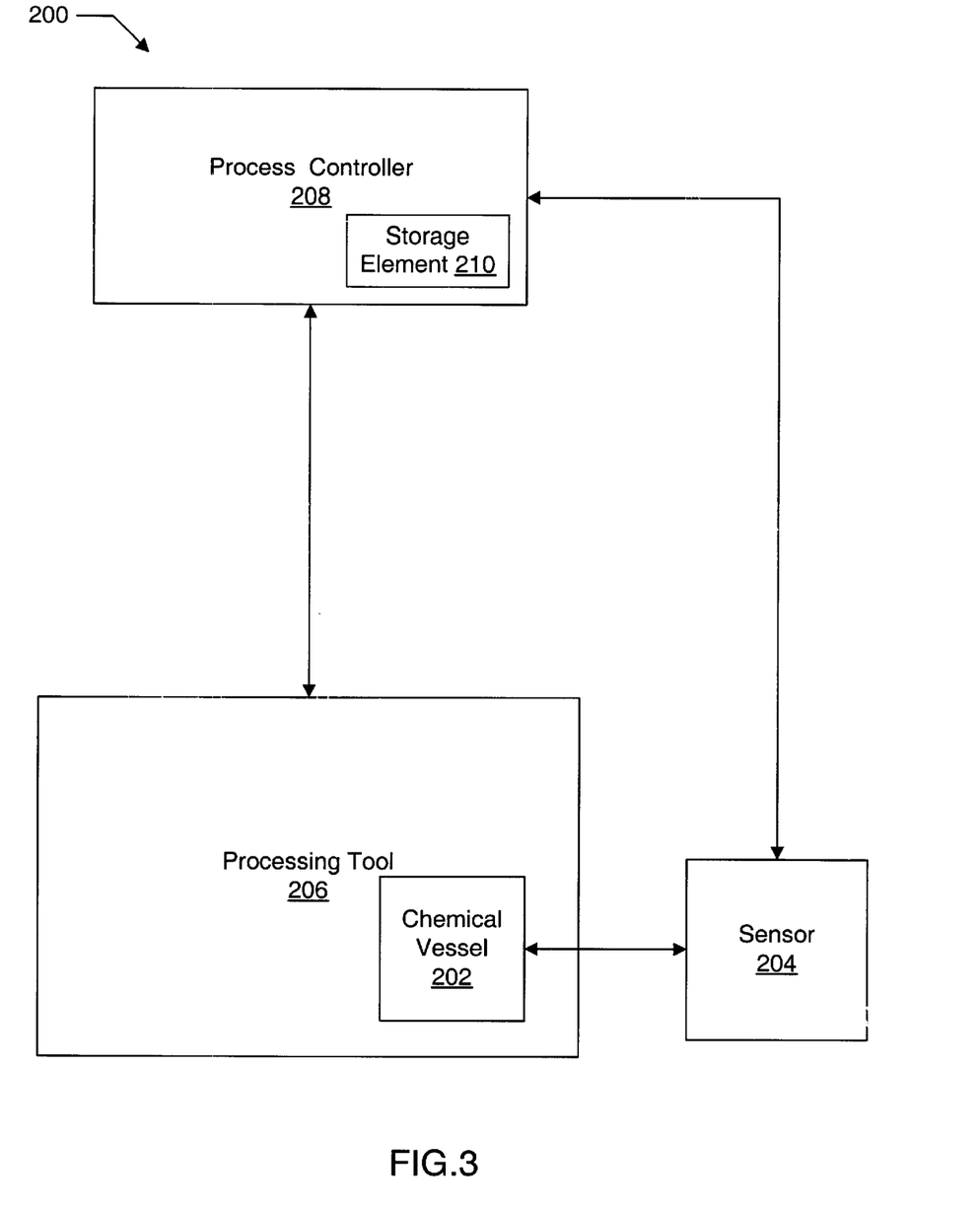
FIG. 3 is a schematic view of a processing system in accordance with an embodiment.

Referring now to the drawings, FIG. 3 presents a schematic view of processing system 200. Processing system 200 may be configured to process a semiconductor topography. Preferably, processing system 200 is configured to performing a cleaning process on one or more semiconductor topographies.

Processing system 200 preferably includes chemical vessel 202, which preferably contains a chemical mixture. The chemical mixture is preferably a cleaning solution, and more preferably is a liquid cleaning solution capable of etching polysilicon (e.g., SC1, SC2, and piranha solutions). The chemical mixture preferably is capable of etching polysilicon substantially isotropically.

Processing system 200 may also include sensor 204. Sensor 204 may be configured to be in fluid communication with chemical vessel 202. Furthermore, the sensor is preferably configured to measure a value of a polysilicon etch rate-effective attribute of the chemical mixture. Measured polysilicon etch rate-effective attribute values are preferably transmitted to process controller 208.

Sensor 204 may be a concentration sensor. Preferably, the chemical mixture comprises a plurality of chemicals. Sensor 204 may be configured to measure a plurality of concentrations of a plurality of chemicals within the chemical mixture. Sensor 204 may be further configured to concurrently measure a temperature of the chemical mixture.

Sensor 204 may be particularly configured to measure the concentration of the component chemicals of the chemical mixture. If, for example, the chemical mixture is an SC1 solution (i.e., certain mixtures of water, hydrogen peroxide, and ammonium hydroxide), then sensor 204 is preferably a sensor particularly configured to measure concentrations of SC1 solutions, such as the Horiba CS220 SC-1 monitor, commercially available from the Horiba Group, Minami-ku, Kyoto, Japan. If the chemical mixture is an SC2 solution (i.e., certain mixtures of water, hydrogen peroxide, and hydrochloric acid), then sensor 204 is preferably a sensor configured to measure concentrations of SC2 solutions, such as the Horiba CS-342 SC-2 monitor. Sensor 204 may also be a sensor particularly configured to measure concentrations of any number of other liquid solutions, including, but not limited to, piranha solutions (i.e., certain mixtures of water, hydrogen peroxide, and sulfuric acid), FPM (i.e., certain mixtures of water, hydrogen peroxide, and hydrofluoric acid), and hydrofluoric acid solutions.

The processing system may further include a process controller. Process controller 228 is preferably configured to direct the performance of the processing method with processing system 200. The process controller may be configured to receive measured polysilicon etch-rate effective attribute values of the chemical mixture from sensor 204. Process controller 208 is preferably further configured to calculate an exposure time to the chemical mixture for the semiconductor topography from the polysilicon etch rate-effective attribute value, an initial polysilicon feature critical dimension of the polysilicon feature, and a goal polysilicon feature CD.

The processing system may further include processing tool 206. Processing tool 206 is preferably configured to receive the exposure time from process controller 208. After receiving the exposure time, processing tool 208 is further preferably configured to expose a semiconductor topography to the chemical mixture for the exposure time. Preferably, the processing tool is configured to expose a plurality of semiconductor topographies (e.g., a lot of 25 wafers) at once. Exposure to the chemical mixture may be performed in chemical vessel 202 or in another vessel (e.g. a processing vessel) to which the chemical mixture is transported. The processing tool may further include multiple vessels (e.g., process chambers, sinks) in which multiple lots of wafers can be processed simultaneously.

Processing tool 208 may expose a semiconductor topography to the chemical mixture by immersing the semiconductor topography in a chemical mixture. In embodiment, processing tool 206 is an automated wet bench. A suitable wet bench may be commercially available from Steag AG, Essen, Germany. Alternately, the processing tool may expose the semiconductor topography to the chemical mixture by spraying the chemical mixture on the semiconductor topography as it is rotating. In an embodiment, processing tool 206 is a spray-cleaning process tool, and preferably is a Semitool Spray Acid Tool, commercially available from Semitool, Inc., Kalispell, Mont.

Process controller 208 is preferably configured to interface with the various components of processing system 200 to direct the processing method. As such, the process controller may be considered to provide "intelligence" for the processing system. Process controller 208 is preferably configured to receive measured etch rate-effective values from the sensor. The process controller may include a display unit configured to display the measured etch rate-effective values. The process controller preferably is configured perform most or all calculations involved with calculating an exposure time.

Process controller 208 may be further configured to calculate a polysilicon etch rate of the chemical mixture from the etch rate-effective attribute value of the chemical mixture, input the polysilicon etch rate of the chemical mixture into an exposure time calculation algorithm, input the initial polysilicon feature CD and the goal polysilicon feature CD into the exposure time calculation algorithm, and calculate an exposure time to the chemical mixture of the polysilicon feature with the exposure time algorithm. In an embodiment in which the chemical mixture contains a plurality of chemicals, process controller 208 may be configured to receive a plurality of concentrations of the plurality of chemicals within the chemical mixture and a temperature of the chemical mixture from sensor 204. Process controller 208 may be further configured to calculate a polysilicon etch rate of the chemical mixture from the plurality of concentrations of the plurality of chemicals within the chemical mixture and from the temperature of the chemical mixture.

Additionally, the actions of processing system are preferably at least partially directed through software. Process controller 208 is preferably a computer configured to execute several sets of programming instructions, e.g., a programmable controller or a PC. The programming instructions may be at least temporarily stored in a storage element of the process controller, e.g., storage element 210. The storage element may be any type of media configured to store, if only temporarily, several groupings of instructions for carrying out several processing steps. Possibilities for storage element 210 include, but are not limited to, magnetic media (e.g., hard drives and floppy disks) and semiconductor memory (e.g., RAM and ROM). Storage element 210 may be located within an element of process controller 208 such as a programmable controller, or may be configured as part of a device distally located from other components of process controller 208.

The programming instructions are preferably Advanced Process Control (APC) instructions, or are preferably at least configured to interface with such programming instructions. For example, process controller 208 may be configured to receive information (e.g., initial and goal polysilicon feature CDs) from a centrally located control system using APC software (e.g., an "Equipment Interface" system). APC software may allow run-to-run control and fault detection in semiconductor wafer fabrication facilities. Suitable APC software for systems as disclosed herein may be ObjectSpace Catalyst, which is commercially available from ObjectSpace Fab Solutions, Austin, Tex.

Figure 1:
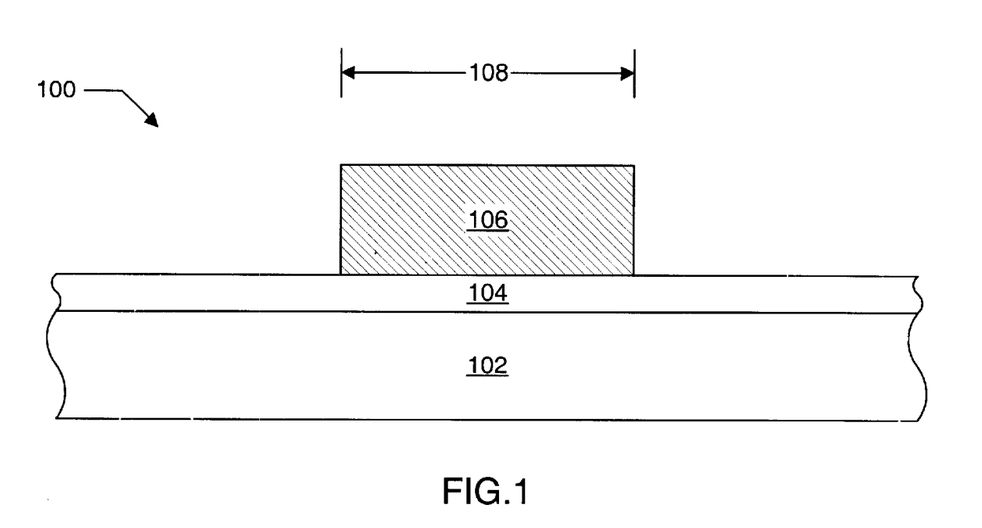
FIG. 1 is a partial cross-sectional view of a semiconductor topography in accordance with an embodiment, in which a gate conductor is arranged above a semiconductor substrate.

FIG. 1 shows a partial cross-sectional view of a semiconductor topography, semiconductor topography 100. A semiconductor topography may include a semiconductor substrate and any structures formed within and above the semiconductor substrate. Semiconductor topography 100 preferably includes semiconductor substrate 102. Semiconductor substrate 102 is preferably a wafer of lightly-doped, single-crystal silicon.

Semiconductor topography 100 also preferably includes a polysilicon feature arranged above semiconductor substrate 102. The polysilicon feature may be a patterned polysilicon structure having clearly defined sidewalls. The sidewalls of the polysilicon feature are preferably substantially perpendicular to semiconductor substrate 102. Preferably, the length of the polysilicon feature is significantly greater than its width. The polysilicon feature may be any of a variety of polysilicon features, including local interconnect structures and gate conductor structures. Preferably, the polysilicon feature is a gate conductor, such as gate conductor 106. Gate conductor 106 is preferably arranged above gate dielectric layer 104.

FIG. 1 preferably shows semiconductor topography 100 at a point in an overall fabrication process after the etching of gate conductor 106 but before performing a cleaning process and gate conductor 106. Gate conductor 106 preferably has an initial gate conductor CD 108. Critical dimensions of gate conductor 106, such as initial CD 108, may be the distance between the air-polysilicon boundaries at a particular height (e.g., mid-level) above the interface between gate conductor 106 and gate dielectric 104. Initial gate conductor CD 108 is preferably a CD of gate conductor 106 before the gate conductor undergoes a cleaning process. Initial gate conductor CD 108, however, does not necessarily equal the PG CD of gate conductor 106, because of critical dimension reduction that may have occurred as a result of previous processing steps. For example, semiconductor topography 100 may undergo an ARC layer removal process prior to FIG. 1 that may reduce the CD of gate conductor 106 from PG CD. Initial gate conductor CD 108 may be calculated using any number of metrology techniques, including the use of microscopes such as scanning electron microscopes.

Figure 2:
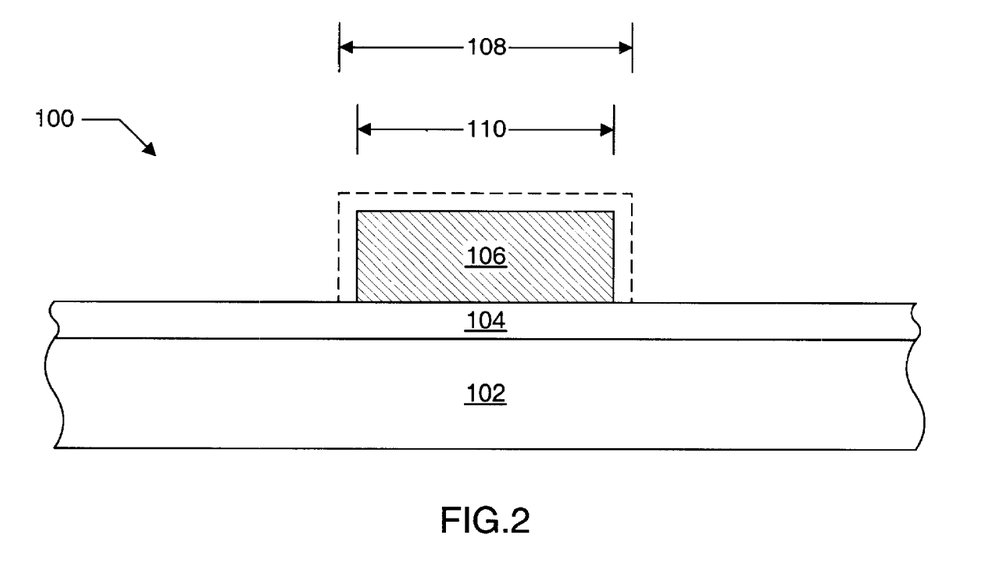
FIG. 2 is a partial cross-sectional view of the semiconductor topography of claim 1, in which the semiconductor topography is exposed to a chemical mixture according to a processing step subsequent to FIG. 2.

FIG. 2 presents a cross-sectional view of semiconductor topography 100 after undergoing an exposure process as described herein (e.g., a cleaning process). The exposure process preferably involves exposing semiconductor topography 100 to a chemical mixture, preferably a cleaning solution. The cleaning solution is preferably one that etches polysilicon. Suitable cleaning solutions include SC1 solutions. After exposure to the cleaning solution, gate conductor 106 preferably has a final gate conductor CD 110. Final gate conductor CD 110 is preferably substantially less than initial CD 108. The difference between final gate conductor CD 110 and initial gate conductor CD 108 may be the CD reduction associated with the cleaning process. Final gate conductor CD 110 is not necessarily the CD of gate conductor 106 after all fabrication processes have been completed, but may only be the CD after performing an initial cleaning step on the gate conductor. As explained above, it is desirable that final gate conductor CD 110 may be substantially equal to a goal gate conductor CD for gate conductor 106. A final gate conductor CD substantially equal to a goal CD may be one less than, e.g., one nm from the goal gate conductor CD.

Figure 4:
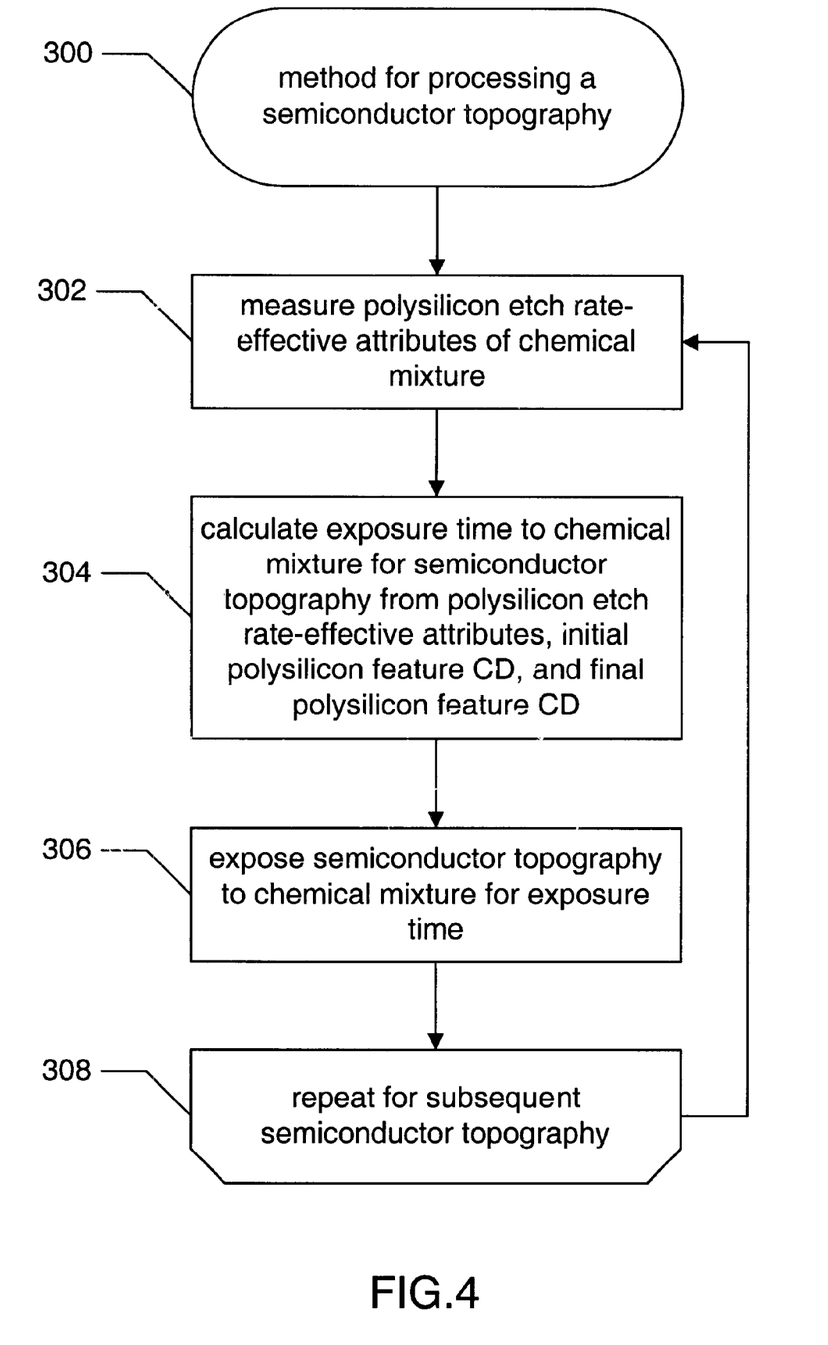
FIG. 4 is a flow diagram of a method for processing a semiconductor topography in accordance with an embodiment.

FIG. 4 is a flow diagram of a method for processing a semiconductor topography. Processing method 300 preferably may be used to process semiconductor topography 100 and similar semiconductor topographies, preferably using processing system 200. Processing method 300 may be in part directed by process controller 208. Programming instructions, preferably residing in storage element 210, may be executed by the control system to direct the operation of components of processing system 200 to perform processing method 300.

First, one or more polysilicon etch rate-effective attribute values may be measured by sensor 204 (step 302). Sensor 204 may transmit the measured values to process controller 208. After receiving the polysilicon etch rate-effective attribute value(s), from the sensor, process controller 208 may calculate the exposure time to a chemical mixture for semiconductor topography 100 from the polysilicon etch rate-effective attributes, the initial polysilicon feature CD (e.g. initial gate conductor 108), and the final polysilicon feature CD (e.g. final gate conductor 110) (step 304). Process controller 208 may then transmit the exposure time to processing tool 206. Processing tool 206 may then expose the semiconductor topography to the chemical mixture for the exposure time (step 306). After exposing the semiconductor topography to the chemical mixture for the exposure time, the final CD of gate conductor 106 may be substantially equal to a goal gate conductor CD.

After completing processing of a first semiconductor topography, processing method 300 may be repeated for a second, subsequent semiconductor topography having a second polysilicon feature arranged above a second semiconductor substrate, in which the second polysilicon feature has an initial second polysilicon feature CD (step 308). That is, steps 302, 304, 306 may be performed for the second semiconductor topography. After exposing the second semiconductor topography to the chemical mixture for the newly calculated exposure time, the second final polysilicon feature CD may be substantially equal to a second polysilicon feature goal CD. Preferably, processing method 300 may be repeated for multiple semiconductor topographies with the same chemical mixture until, e.g., the properties of the chemical mixture reach undesirable levels.

Figure 5:
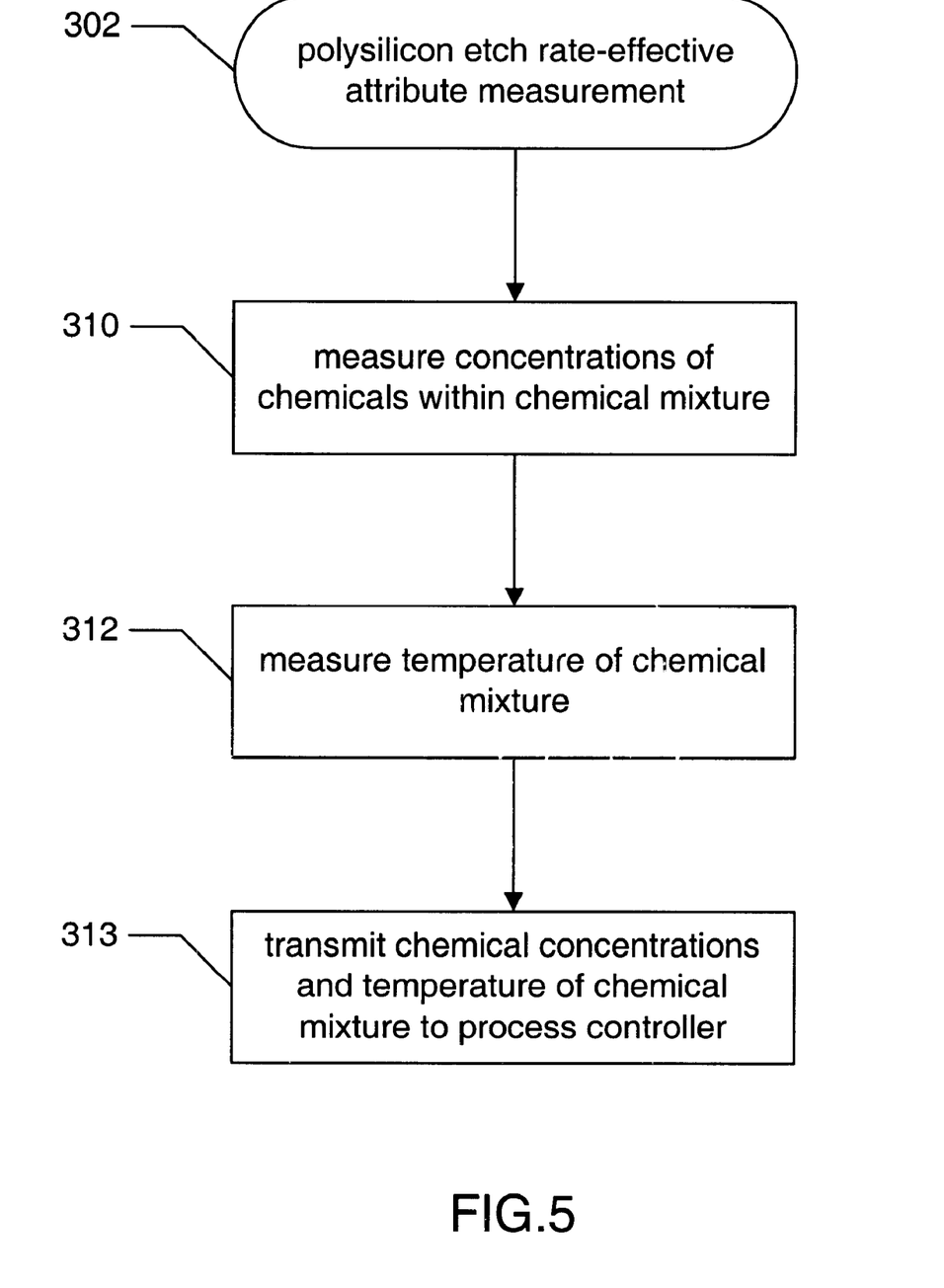
FIG. 5 is a flow diagram of a method for measuring polysilicon etch rate-effective attributes of a chemical mixture that may be performed as part of the method shown in FIG. 4.

FIG. 5 is a flow diagram illustrating a process for measurement of polysilicon etch rate-effective attributes (step 302). To measure the attributes, a flow of the chemical mixture may be transported from chemical vessel 202 to sensor 204 and back to chemical vessel 202. Measuring a polysilicon etch rate-effective attribute value of the chemical mixture preferably involves measuring a plurality of concentrations of a plurality of chemicals within the chemical mixture (step 310) and measuring a temperature of the chemical mixture (step 312). These attribute values may be measured with a suitably configured concentration sensor (e.g., sensor 204). Measured polysilicon etch rate-effective attribute value (e.g., the plurality of concentrations of a plurality of chemicals within the chemical mixture and the temperature of the chemical mixture) may be transmitted to process controller 208 as they are measured (step 313). Process controller 208 preferably receives the measured the plurality of concentrations of a plurality of chemicals within the chemical mixture and the temperature of the chemical mixture and stores them (at least temporarily) to be used in calculation of a exposure time.

Figure 6:
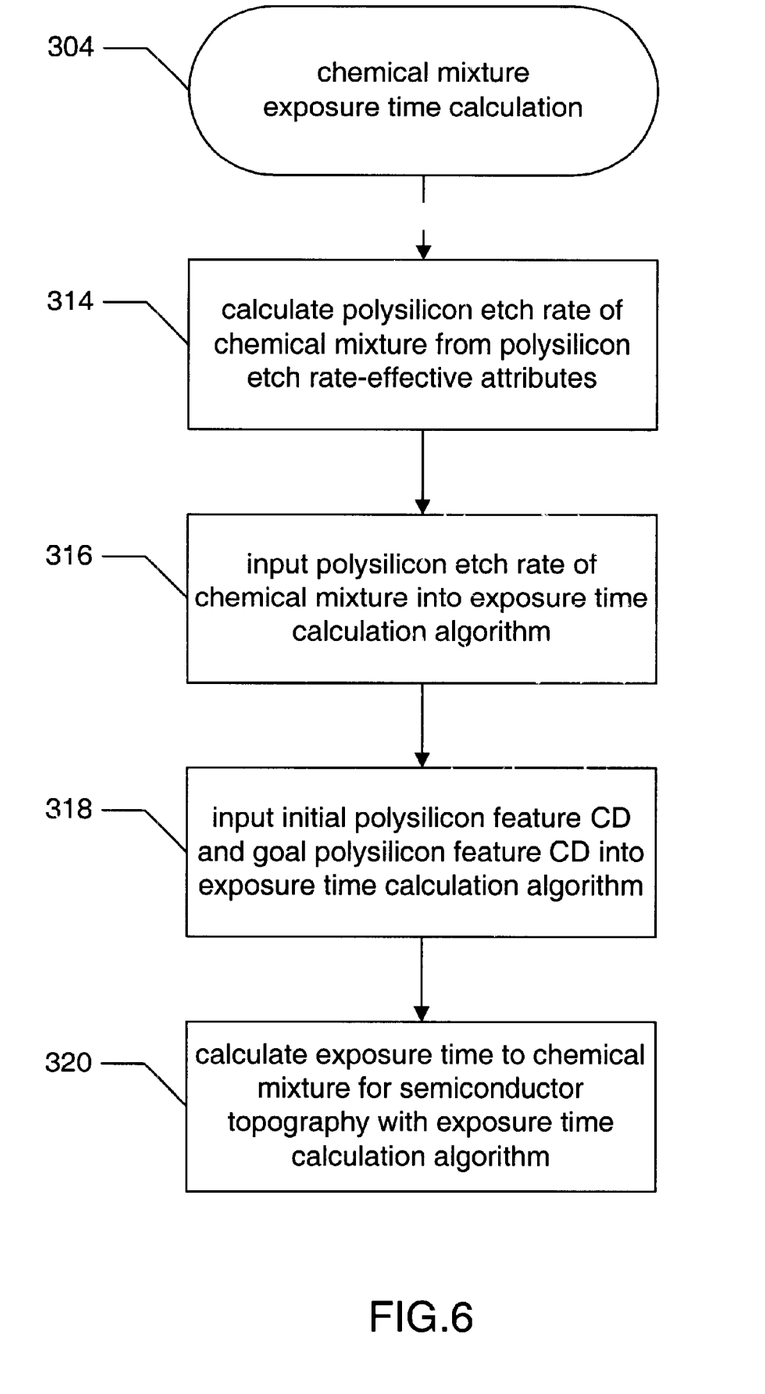
FIG. 6 is a flow diagram of a method for calculating a chemical mixture exposure time that may be performed as part of the method shown in FIG. 4.

FIG. 6 is a flow diagram illustrating a process for calculating an exposure time to he chemical mixture for semiconductor topography 100. The process preferably includes calculating a polysilicon etch rate of the chemical mixture from the etch rate-effective attribute value of the chemical mixture (step 314). The polysilicon etch rate of the chemical mixture may be calculated in a variety of ways, for example, by using formulas, fits to collected data, or a lookup table of polysilicon etch rates at a variety of values of the polysilicon etch rate-effective attribute or attributes. The polysilicon etch rate is further preferably calculated for the particular properties of the polysilicon of which the feature is composed, and may take into account, the presence or absence of dopants, method of doping if dopants are present (e.g., in situ vs. implanted), the doping profile of the feature (i.e., how dopants are distributed within the feature), the grain structure of the feature (e.g., blanket polysilicon vs. hemispherical grain polysilicon), as well as a variety of other properties of the polysilicon feature that may affect the etch rate of the chemical mixture for that feature.

One or more etch rate-effective attribute values may be used in calculating a polysilicon etch rate. Preferably, however, the etch rate-effective attributes used in calculating the polysilicon etch rate of the chemical mixture are a plurality of concentrations of a plurality of chemicals within the chemical mixture and a temperature of the chemical mixture. The concentrations used in calculating the polysilicon etch rate of the chemical mixture are preferably all chemicals that affect the polysilicon etch rate of the chemical mixture. For example, if the chemical mixture is an SC1 solution, then sensor 204 may be configured to measure the hydrogen peroxide and ammonium hydroxide concentrations (the water concentration can be derived from these if necessary).

After calculation, the polysilicon etch rate of the chemical mixture may be input into the exposure time calculation algorithm (step 316). The exposure time calculation algorithm may include a set of precisely defined operations, rules, or processes for calculating the exposure time to the chemical mixture for the semiconductor topography. The exposure time calculation algorithm may accept any number of inputs, may incorporate any number of calculations, and may employ any variety of techniques to calculate the exposure time.

The initial polysilicon feature CD and the goal polysilicon feature CD may also be input into the exposure time calculation algorithm (step 318). Preferably, the initial polysilicon feature CD may be calculated in a metrology process performed after defining the feature, and may then be transmitted to, e.g., a process controller directing the execution of the method. Alternately, the initial polysilicon feature CD may be a stored value within, e.g., a storage element of the process controller, produced in an earlier calculation or derived from historical data. The semiconductor topography preferably comprises a plurality of polysilicon features. As such, the initial, final, and goal polysilicon feature CDs are preferably an aggregate CD for the polysilicon features of an entire semiconductor topography, and may not necessarily be the CD of any one particular feature. For example, the above-described polysilicon feature CDs may be average CD values for all polysilicon features of interest on a semiconductor topography. In addition, a feature CD (e.g., an initial polysilicon feature CD may be determined not by measure CDs of any polysilicon features of a given semiconductor topography but by measuring feature CDs of other semiconductor topographies that have undergone similar processing steps.

The goal polysilicon feature may be the desired CD after the semiconductor topography is exposed to the chemical mixture. The goal polysilicon feature CD may likewise be transmitted for each semiconductor topography as it is processed, but may also be a predetermined value stored in, e.g., a storage element of a process controller. All CD values may be transmitted to process controller from a point outside of the processing system, e.g., a central control system overseeing fab operations (e.g., "Equipment Interface" or "Fab Automation"). Once the appropriate attributes have been input into the exposure time calculation algorithm, process controller 208 may execute programming instructions for calculating an exposure time to the chemical mixture for semiconductor topography 100 (step 320).

Figure 7:
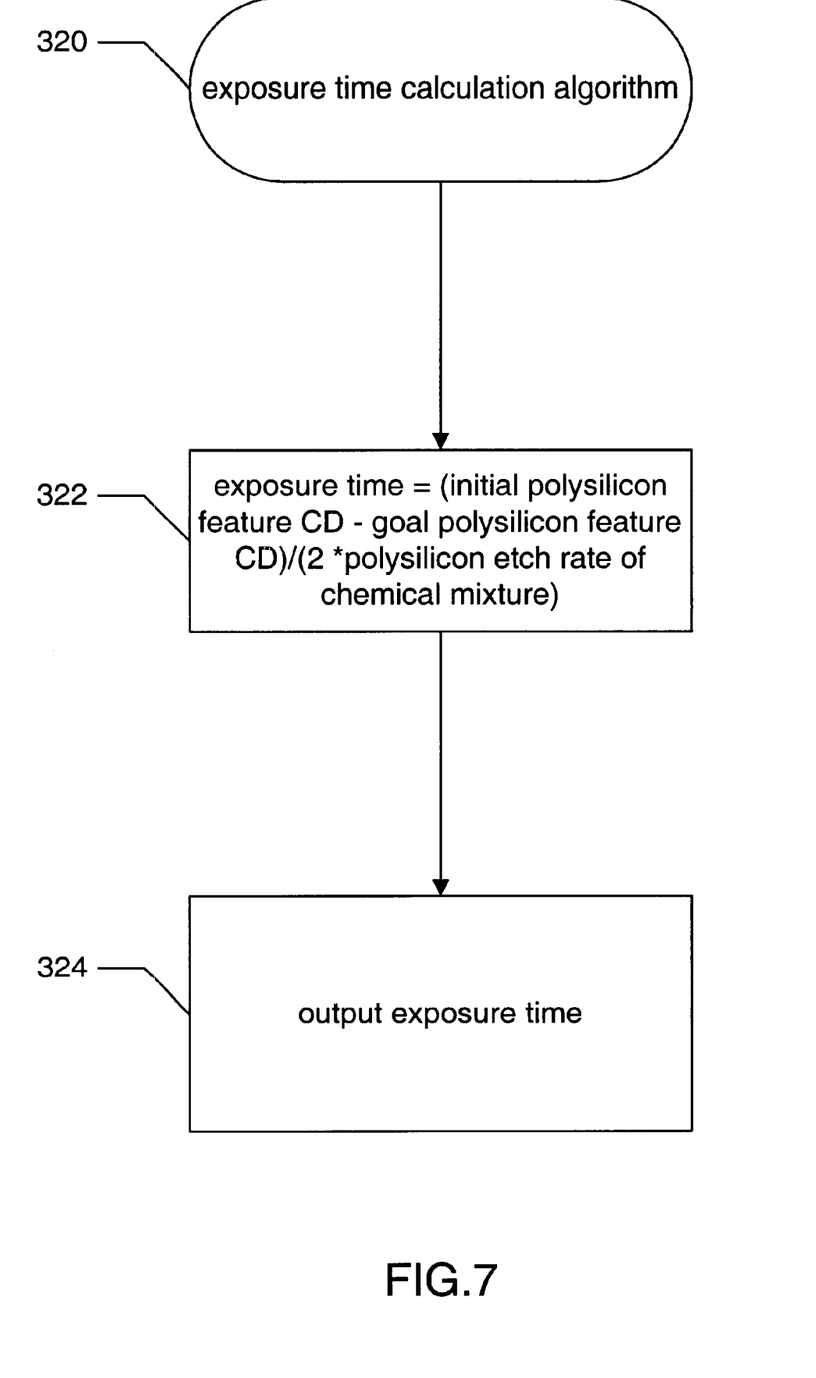
FIG. 7 is a flow diagram of a method for executing an exposure time calculation algorithm that may be performed as part of the method shown in FIG. 6.

FIG. 7 illustrates a potential process for executing an exposure time calculation algorithm (step 320). While, as stated above, the exposure time algorithm may accept any number of inputs in calculating the exposure time, the algorithm preferably calculates an exposure time with the polysilicon etch rate of the chemical mixture, the initial polysilicon feature CD, and the goal polysilicon feature CD. The chemical mixture is preferably a liquid capable of etching polysilicon. Consequently, the chemical mixture preferably etches polysilicon isotropically (i.e., in substantially the same rate in all directions). Therefore, the chemical mixture may etch the sidewalls of the polysilicon feature at substantially the same rate. As the critical dimension of the polysilicon feature may be defined by the distance from sidewall to sidewall, the CD reduction rate of the chemical mixture is preferably substantially twice the polysilicon etch rate of the chemical mixture. As the polysilicon etch rate of the chemical mixture preferably represents the average polysilicon etch rate of the chemical mixture during the time the semiconductor topography is exposed to the chemical mixture, the exposure time may be calculated as exposure time=(the initial polysilicon feature CD–the goal polysilicon feature CD)/(2*the polysilicon etch rate of the chemical mixture), and an exposure time variable is preferably set to the calculated exposure time value to be used in subsequent processing steps (step 322). The exposure time may be output from the process to be used by other processing steps (step 324).

In an embodiment, the chemical mixture is an SC1 cleaning solution having a concentration of 1 part ammonium hydroxide: 4 parts hydrogen peroxide: 20 parts DI water. The solution is maintained at a temperature of 60° C. At this temperature, the solution may have a blanket polysilicon etch rate of 0.13 nanometers per minute. If the goal polysilicon feature CD is 3 nanometers less than the initial polysilicon CD, then exposure time=3/(2*0.13 nanometers/min)=11.5 minutes (step 322). (This chemical mixture may then be exposed to the semiconductor topography (or lot of semiconductor topographies) for the calculated exposure time. The chemical mixture could then be used on a subsequently processed second semiconductor topography or lot of semiconductor topographies.

Figure 8:
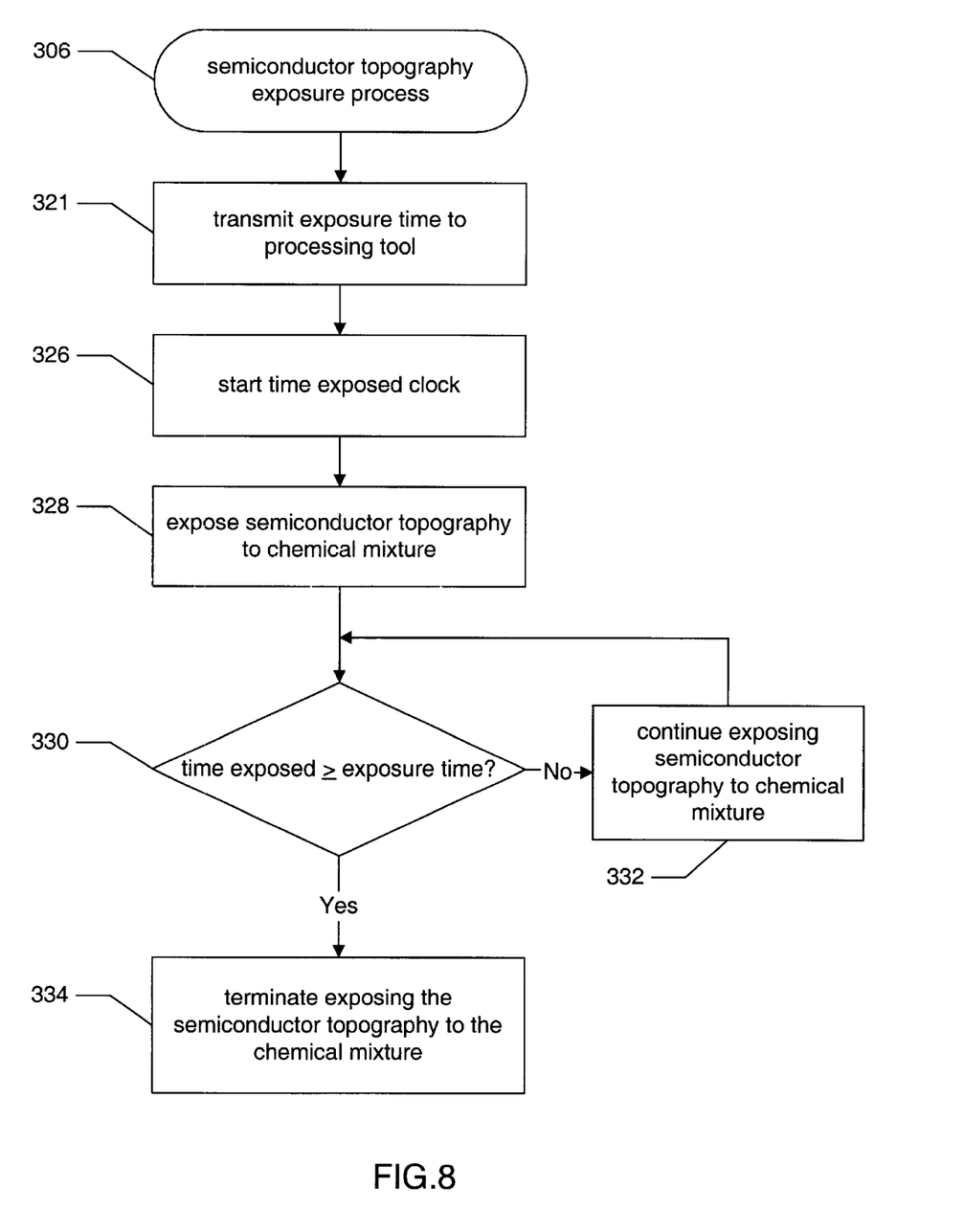
FIG. 8 is a flow diagram of a method for exposing a semiconductor topography to a chemical mixture that may be performed as part of the method shown in FIG. 4.

FIG. 8 illustrates a potential process for exposing semiconductor topography 100 to the chemical mixture (step 306). The exposure time (preferably calculated in step 304) may first be transmitted to processing too 206 (step 321). Then, a time exposed clock may be started (step 326). The time exposed clock preferably records the elapsed time since the semiconductor topography undergoing processing is first exposed to the chemical mixture. As the time exposed clock is started, semiconductor topography 100 may be exposed to the chemical mixture (step 328). A semiconductor topography may be exposed to the chemical mixture in a variety of manners. For example, the semiconductor topography may be immersed in the chemical mixture. In addition, the chemical mixture may be sprayed on the semiconductor topography, preferably as it rotates (to reduce surface tension).

After beginning exposure of semiconductor topography 100 to the chemical mixture, it may be periodically determined whether the time exposed ≧ the exposure time (step 330). If it is not, exposure of the semiconductor topography to the chemical mixture may be continued (step 332). After a suitable delay, step 330 may be executed again. (The interval between executions of step 330 may be as long or short as desired.) Once time exposed is ≧ the exposure time, the exposure of the semiconductor topography to the chemical mixture may be terminated (334). In a case where exposure of the semiconductor topography to the chemical mixture involves immersion, then termination may involve withdrawing the semiconductor topography from the mixture. In a case where exposure of the semiconductor topography to the chemical mixture involves spraying, then termination may involve discontinuing spraying of the chemical mixture on the semiconductor topography. In any case, the semiconductor topography is preferably rinsed with deionized water and dried after step 306 is complete. If the exposure process is not carried out in one step (for example, some sort of spray, rinse, and then spray again sequence), then the time exposed may be the sum total of time that the semiconductor topography is exposed to a cleaning solution. The exposure process may then be adjusted accordingly.

The exposure process is not necessarily restricted to application to a gate conductor after all layers overlying the gate have been removed, but may be applied to any situation in which the exposed sidewalls of a polysilicon feature are etched (e.g., as part of a ARC strip process). The overall processing method may be especially useful when the chemical mixture will be used repeatedly and the etch rate of the chemical solution changes unpredictably over time.

Further modifications and alternative embodiments of various aspects of the invention will be apparent to those skilled in the art in view of this description. Accordingly, this description is to be construed as illustrative only and is for teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for processing a semiconductor topography, comprising:
   providing a semiconductor topography, the semiconductor topography comprising a polysilicon feature arranged above a semiconductor substrate, wherein the polysilicon feature comprises an initial polysilicon feature critical dimension (CD);
   providing a chemical mixture contained in a chemical vessel;
   measuring a polysilicon etch rate-effective attribute value of the chemical mixture;
   calculating an exposure time to the chemical mixture for the semiconductor topography from the polysilicon etch rate-effective attribute value of the chemical mixture, the initial polysilicon feature CD, and a goal polysilicon feature CD; and
   exposing the semiconductor topography to the chemical mixture for the exposure time.

2. The method of claim 1, wherein after said exposing the semiconductor topography to the chemical mixture for the exposure time, the polysilicon feature comprises a final polysilicon feature CD substantially equal to the goal polysilicon feature CD.

3. The method of claim 2, wherein said calculating the exposure time to the chemical mixture for the semiconductor topography comprises:
   calculating a polysilicon etch rate of the chemical mixture from the etch rate-effective attribute value;
   inputting the polysilicon etch rate of the chemical mixture into an exposure time calculation algorithm;
   inputting the initial polysilicon feature CD and a goal polysilicon feature CD into the exposure time calculation algorithm; and
   calculating an exposure time to the chemical mixture for the polysilicon feature with the exposure time calculation algorithm.

4. The method of claim 3, wherein the chemical mixture comprises a plurality of chemicals, and wherein said measuring an etch rate-effective attribute value of a chemical mixture comprises:
   measuring a plurality of concentrations of the plurality of chemicals within the chemical mixture; and
   measuring a temperature of the chemical mixture; and
   wherein said calculating a polysilicon etch rate of the chemical mixture from the etch rate-effective attribute comprises calculating a polysilicon etch rate of the chemical mixture from the plurality of concentrations of the plurality of chemicals within the chemical mixture and from the temperature of the chemical mixture.

5. The method of claim 3, wherein said calculating an exposure time to the chemical mixture for the semiconductor topography with the exposure time calculation algorithm further comprises setting the exposure time=(the initial polysilicon feature CD−the goal polysilicon feature CD)/(2*the polysilicon etch rate of the chemical mixture).

6. The method of claim 3, wherein said exposing the semiconductor topography to the chemical mixture for the exposure time comprises:
   transmitting the exposure time to a processing tool configured to expose the semiconductor topography to the chemical mixture during operation;
   starting a time exposed clock;
   exposing the semiconductor topography to the chemical mixture;
   continuing said exposing the semiconductor topography to the chemical mixture until the time exposed is greater than or equal to the exposure time; and
   then terminating said exposing the semiconductor topography to the chemical mixture.

7. The method of claim 6, wherein said exposing the semiconductor topography to the chemical mixture comprises immersing the semiconductor topography in the chemical mixture.

8. The method of claim 5, wherein the semiconductor topography is a first semiconductor topography, and further comprising after said exposing the semiconductor topography to the chemical mixture for the exposure time:

providing a second semiconductor topography, the second semiconductor topography comprising a second polysilicon feature arranged above a second semiconductor substrate, wherein the second polysilicon feature comprises an initial second polysilicon feature CD; and repeating for the second semiconductor topography said measuring an polysilicon etch rate-effective attribute value of a chemical mixture, said calculating an exposure time to the chemical mixture for the semiconductor topography, and said exposing the semiconductor topography to the chemical mixture for the exposure time, and wherein after said repeating, the second polysilicon feature comprises a final second polysilicon feature CD substantially equal to a goal second polysilicon feature CD.

9. The method of claim 2, wherein the polysilicon feature is a polysilicon gate conductor arranged upon a gate dielectric layer.

10. The method of claim 1, wherein the chemical mixture is configured to etch polysilicon.

* * * * *